United States Patent [19]
Mobley

[11] Patent Number: 4,888,733
[45] Date of Patent: Dec. 19, 1989

[54] NON-VOLATILE MEMORY CELL AND SENSING METHOD

[75] Inventor: Kenneth J. Mobley, Colorado Springs, Colo.

[73] Assignee: Ramtron Corporation, Colorado Springs, Colo.

[21] Appl. No.: 243,414

[22] Filed: Sep. 12, 1988

[51] Int. Cl.$^4$ .................. G11C 11/22; G11C 7/00
[52] U.S. Cl. ............................ 365/145; 365/149; 365/189.07
[58] Field of Search ............... 365/145, 149, 117, 189

[56] References Cited

U.S. PATENT DOCUMENTS 4,103,342  7/1978  Miersch et al. ............... 365/149
4,809,225  2/1989  Dimmler et al. ............... 365/149

OTHER PUBLICATIONS

Merz et al., "Ferroelectric Storage Devices", Bell Laboratories Record, Sep. 1955, pp. 340, 342.
Pulvira, "Research on the Application of Ferro- and Ferrielectric Phenomena in Computer Devices", Oct. 1963, pp. 40–41.

Primary Examiner—Stuart N. Hecker
Assistant Examiner—Michael A. Whitfield
Attorney, Agent, or Firm—Edward D. Manzo

[57] ABSTRACT

A ferroelectric memory cell has one capacitor isolated from bit lines by two transistors, one on each side. The cell is read by pulsing the capacitor in one direction, then the other, storing developed charge on other capacitors or the like, and comparing voltages.

17 Claims, 1 Drawing Sheet

NON-VOLATILE MEMORY CELL AND SENSING METHOD

FIELD OF THE INVENTION

The present invention relates to non-volatile memory cells, and particularly to memory cells which use the polarization of ferroelectric capacitors in the storage operation.

BACKGROUND OF THE INVENTION

The present invention relates to non-volatile memory cells using ferroelectric capacitors. A ferroelectric capacitor is described generally in Rohrer U.S. Pat. No. 3,728,694. It shows a hysteresis curve for a ferroelectric material plotting polarization against applied field. As described in the '694 patent and in the currently pending patent application of my colleague, S. Sheffield Eaton, Jr., U.S. Ser. No. 013,746 entitled "Self-Restoring Ferroelectric Memory," filed Feb. 12, 1987, the entire disclosure of which is incorporated herein by reference, non-volatile memories can be designed which use the polarization state of the ferroelectric material as the physical phenomenon or property by which binary data can be stored. A memory cell may consist of simply a capacitor of the ferroelectric type having two plate electrodes, which may be coupled to respective row and column lines, as illustrated as prior art in FIG. 2 of the Eaton '746 application. That arrangement, unfortunately, has not been successful because the application of the signal to read one such capacitor in a matrix of many resulted in disturbing other capacitors along the same row and/or column.

Accordingly, better memory cells which use ferroelectric capacitors have been desired for many years, and some memory cells are illustrated in the Eaton '746 application. In FIG. 3 thereof, a one transistor-one capacitor memory cell is illustrated. Briefly, the ferroelectric capacitor has two plate electrodes, one of which is coupled to a conductor which may be referred to as a "plate line." The other electrode of the capacitor is coupled via a switching device such as the source-drain path of as a field effect transistor to a bit line. Such a transistor is controlled by a word line coupled to the gate electrode of the transistor. Further shown in FIG. 3 of that Eaton application is a sense amplifier and a dummy cell of similar configuration, although the capacitance of the ferroelectric capacitor in the dummy cell may be different than that of the capacitor in the operative cell. That configuration permitted a new type of operation concerning reading the polarization state of the ferroelectric capacitor.

The '746 Eaton application also disclosed in FIG. 4 and FIG. 6 a two transistor, two capacitor memory cell wherein a sense amplifier was connected to complementary bit lines. As in the Eaton FIG. 3 embodiment described, each of the two capacitors is coupled by the source-drain path of a respective field effect transistor to a respective bit line. Both transistors are gated by a word line, and the other plates of the capacitors are both coupled to a plate line which can run parallel to the word line, as shown in FIGS. 4 and 5, or which can be perpendicular to the word line, as shown in FIG. 6. Thus, by combining a ferroelectric capacitor with a transistor to provide access to the capacitor, Eaton was able to provide a measure of isolation to the capacitors which were not being selected for reading in a matrix of memory cells.

The present invention provides further isolation for ferroelectric capacitors. The invention also provides a new manner of reading the polarization state of a ferroelectric capacitor.

SUMMARY OF THE INVENTION

A non-volatile memory cell which can be used in a matrix or array of memory cells combines a ferroelectric capacitor with two switchable devices, preferably transistors. Particularly, one plate of the capacitor is isolated from external influences by one transistor, and the other plate is isolated by the other transistor. This is conveniently achieved in the preferred apparatus embodiment by providing a pair of bit lines along which a plurality of memory cells may be disposed. For convenience, these may be called the left and right bit lines. The sourcedrain path of one transistor couples the left bit line to one capacitor plate, and the source-drain path of the other transistor couples the other capacitor plate to the right bit line. Both of the transistors in the preferred apparatus embodiment are gated by a single word line.

Another aspect of the invention addresses the manner in which a ferroelectric capacitor used as a non-volatile memory element is read. According to this aspect of the invention, a voltage is applied to one side of the capacitor, preferably by a first voltage pulse, to drive the polarization of the capacitor (from wherever it is on the hysteresis curve) to a known point. When the first pulse terminates (the applied voltage is removed), the ferroelectric capacitor returns to a relatively known polarization. In conjunction with this method step, there is stored a first value of charge which represents, for example, the difference in polarization between the initial capacitor state and its state after this first voltage pulse terminates.

Then another value is obtained from the same ferroelectric capacitor with which to compare the first stored value. In the preferred embodiment this is done by applying a second voltage pulse opposite in sense to the first voltage pulse, to drive the ferroelectric capacitor to another known point on the hysteresis curve. When the second voltage pulse terminates, the released charge represents the difference in polarization between the first relatively known position and the second relatively known position, and these two positions correspond to ordinate crossings on the hysteresis curve. A value is stored, preferably relating to the charge, and this second value is compared to the first stored value to determine the state of the cell.

BRIEF DESCRIPTION OF THE DRAWINGS

In describing the preferred embodiments of the present invention, reference is made to accompanying drawings wherein.

DETAILED DESCRIPTION OF THE PREFERRED EMBODIMENT

Figure 1:
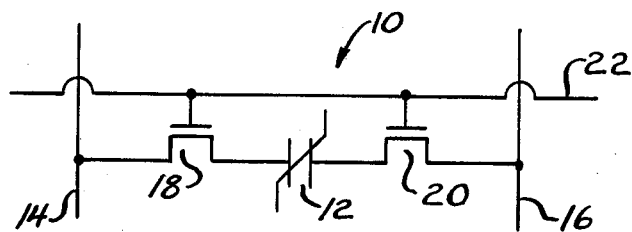
FIG. 1 illustrates a two transistor, one capacitor memory cell according the present invention.

FIG. 1 illustrates a memory cell 10 having a ferroelectric capacitor 12 coupled to bit lines 14, 16 via the source-drain paths of switchable devices, illustratively shown as N channel field effect transistors 18, 20. The gate electrodes of transistors 18, 20 are coupled to a word line 22. It will be understood that other types of switchable devices can be used. It is not required for the present invention that the devices be transistors, that they be N channel, or that they be field effect devices. The present invention can be used with P type transistors, bipolar transistors, or other switchable devices which permit a respective plate of capacitor 12 to be relatively isolated from its corresponding bit line 14 or 16 until an appropriate signal is applied via word line 22.

This configuration allows the ferroelectric capacitor 12 to be locally isolated so that the memory cells 10 on an unselected word line cannot be disturbed while another memory cell on the same bit line pair 14, 16 is being accessed. This prevents any disturb pulse from reaching an unselected capacitor 12, which could otherwise destroy the data stored in capacitor 12 by virtue of the polarization state of the ferroelectric material used as a dielectric between the conductive capacitor plates. Also, although a particular row can be chosen by energizing or pulsing word line 22, voltages need not be applied except on the bit lines 14, 16 corresponding to the selected column.

Another advantage of this configuration is that either plate of capacitor 12 can be left with either a positive or negative potential after it has been accessed, independently of the other plate from the same capacitor or the plates of any other memory cells. Moreover, either plate of the capacitor can be independently pulsed or sensed. The symmetry of the memory cell also permits layouts which have identical load capacitances on both bit lines 14, 16.

A method is now described by which a ferroelectric capacitor, such as the one shown in FIG. 1, can be written to and read. It will be understood that this particular method is not the only method by which the memory cell 10 of FIG. 1 can be written into or read, nor is this method of reading a ferroelectric capacitor applicable to only this particular cell.

Figure 2:
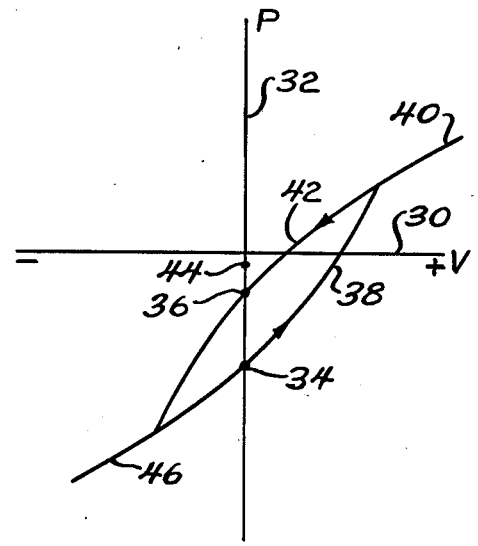
FIG. 2 represents a hysteresis curve for a ferroelectric capacitor.

An improved method of reading a ferroelectric capacitor is now described. FIG. 2 shows a hysteresis curve for a ferroelectric material used as a capacitor dielectric. In FIG. 2, an abscissa 30 represents voltage applied across the capacitor plates. An ordinate 32 represents the polarization, and therefore the charge stored on the capacitor plates. It will be seen that the hysteresis curve of FIG. 2 has a first ordinate crossing 34 and a second ordinate crossing 36. As can be seen, the hysteresis curve is not symmetric around the axes. In fact, the hysteresis curve may be symmetric around the axes, but the present invention is designed to accommodate drifts from the ideal position in the hysteresis curve which are due illustratively to redistribution of charge in the ferroelectric material. This can occur when the ferroelectric capacitor is left in one state for a relatively long period of time.

Direction arrows have been included in FIG. 2 indicating the manner in which the hysteresis curve is traversed. Thus, if the capacitor is at a state 34 with zero volts applied, and then a positive voltage is applied, the polarization moves along the curve portion 38 to a point 40, for example. When the positive voltage is removed, the polarization moves along portion 42 of the curve, ideally, until it returns to point 36. It may happen that in traversing this loop, the ferroelectric material may not arrive at point 36 in a non-ideal situation, but instead may arrive at a point 44. In any event, wherever the polarization crosses the ordinate in FIG. 2, if a negative voltage is applied, the polarization moves to another point 46 corresponding to the applied negative voltage. When the negative voltage is removed and brought back to zero, the polarization returns to point 34 or some nearby point.

Figure 3:
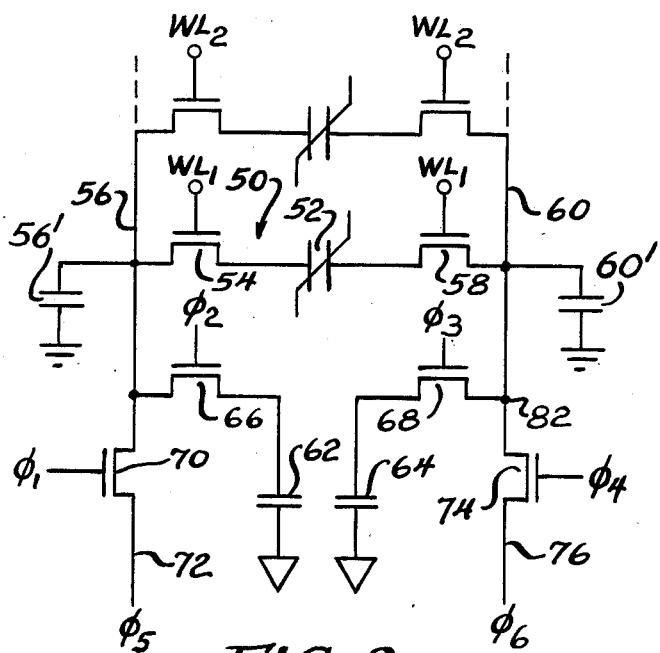
FIG. 3 illustrates a circuit which can be used for practicing the invented double pulse read method.

FIG. 3 shows one illustrative circuit 50 which can be used to apply the double pulse read method of the present invention. In this method, a hysteresis curve of the general sort depicted in FIG. 2 is employed by sequentially pulsing a ferroelectric capacitor in different directions to move the polarization along the hysteresis loop. Values are stored for comparison purposes at selected times during this process, and a comparison of those values after the loop has been traversed results in a determination of the data stored originally in the capacitor.

Thus, FIG. 3 shows a ferroelectric capacitor 52 coupled via the source-drain path of a transistor 54 to a bit line 56. The other capacitor plate is similarly coupled by a further transistor 58 to a bit line 60. Transistors 54 and 58 are coupled to a word line WL1. Other word lines, such as WL2, can intersect bit lines 56 and 60, and each such word line would, as shown in FIG. 3, couple a ferroelectric capacitor (selectively) to the bit lines when a proper voltage is applied to the word line. Temporary data storage during the read process for any ferroelectric capacitor in the column defined by bit lines 56, 60 is performed by capacitors 62, 64 which are coupled via the source-drain paths of transistors 66, 68 respectively to bit lines 56, 60. Bit line 56 is coupled via the source-drain path of a transistor 70 to an input line 72. Bit line 60 is coupled via the source-drain path of a transistor 74 to an input line 76. The gate electrodes of transistors 70, 66, 68, and 74 are respectively coupled to receive timing signals phi 1, phi 2, phi 3, and phi 4 illustrated in FIG. 4. Additionally, a signal phi 5 is applied to input line 72, and phi 6 is applied to input line 76, these signals also being shown in FIG. 4. It will be seen that in circuit 50, N channel field effect transistors are employed, but it must be understood that other types of switching devices or technologies can be used within the scope of the invention.

Nevertheless, when using N channel transistors as depicted in FIG. 3, when a positive voltage (exceeding a threshold voltage) is applied to the gate electrode of a transistor, it turns on the transistor, assuming proper source-drain voltages. As indicated supra, in this method the ferroelectric capacitor is pulsed twice to develop values which are combined, preferably by comparing them against each other, to determine the state of the capacitor.

The memory cell which includes ferroelectric capacitor 52 is selected, in the customary manner, by "turning on" word line WL1, thereby to turn on transistors 54 and 58. This couples the plates of capacitor 52 to bit lines 56, 60. With reference to the illustrative FIGS. 3 and 4, at a time $t_0$ the signals phi 1, phi 2, phi 3, and phi 4 are all high, meaning that transistors 70, 66, 68 and 74 are on. However, phi 5 and phi 6 are at ground at this time, so no differential voltage is applied across the plates of capacitors 52, 62, or 64 and all nodes are precharged to ground. It can be assumed for ease of description that at this time $t_0$, the ferroelectric material in capacitor 52 is at a polarization state 34 or 36 (FIG. 2) which represents the stored data.

Between times $t_0$ and $t_1$, a positive pulse 80 (FIG. 4) is applied to the left plate of capacitor 52. Pulse 80 in phi 5 is a positive excursion occurring on line 72 while transistors 54, 58, 68 and 70 are still on. Transistors 66 and 74 are off during pulse 80. Pulse 80 is applied via the source-drain paths of transistors 70 and 54, and it drives the ferroelectric capacitor 52 to point 40 (FIG. 1) where it stores a charge proportional to P40, regardless of whether it started at state 34 or 36. (It will be understood that "P40" refers to the polarization at point 40.) When pulse 80 terminates, ferroelectric capacitor 52, moving down leg 42 of the hysteresis loop of FIG. 2, ends up at state 36 or 44, where it stores charge Q36 or Q44, as the case may be. Because transistor 68 is on, however, charge is stored also on capacitor 64. The voltage V64 resulting on capacitor 64 is proportional to the difference in charge between states 34 and 36 or 36 and 44, and is given by the equation:

$$V64 = \frac{-(Q34 - Q36)}{C72 + C64} \text{ or } \frac{-(Q36 - Q44)}{C72 + C64}$$

depending on whether capacitor 52 started at state 34 or state 36, and where C64 and C72 are the capacitances of capacitors 64 and 72 respectively. It is assumed that the capacitance of the bit lines, represented pictorially by capacitors 56' and 60', are large compared to C52, so that the voltage at a node 82 has remained close to ground.

Figure 4:
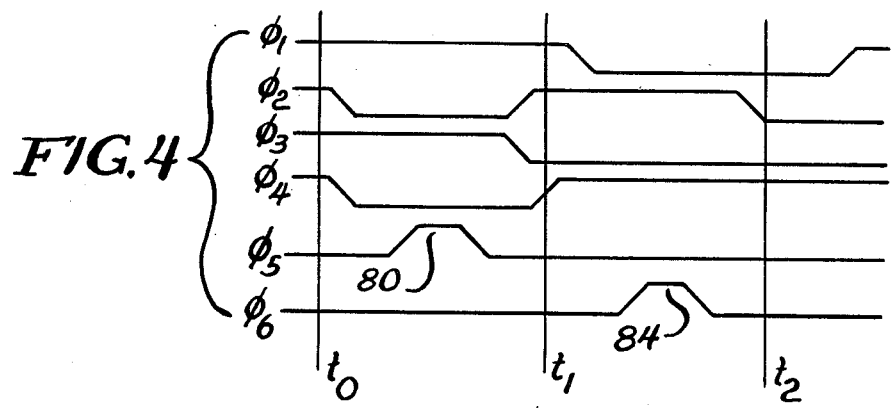
FIG. 4 represents timing diagrams useful in the FIG. 3 circuit.

Between times $t_1$ and $t_2$, a second pulse 84 (FIG. 4) is applied, now on input line 76. Transistor 74 is on (because phi 4 is high), so its source-drain path couples pulse 84 to the right plate of capacitor 52. It will be understood that transistors 54 and 58 are on because the proper voltage has been applied to the gate electrodes via a signal on word line WL1. Transistor 68 is off because phi 3 has dropped to ground. Similarly, transistor 70 is off, illustratively. However, transistor 66 is on because phi 2 has been high during pulse 84, as seen in FIG. 4. This drives the ferroelectric capacitor 52 along the hysteresis loop of FIG. 2, thereby storing charge on capacitor 62. The voltage V62 on capacitor 62 is represented thus:

$$V62 = \frac{Q36 - Q34}{C74 + C62} \text{ or } \frac{Q44 - Q34}{C74 + C62}$$

depending on whether the capacitor was brought to state 36 or 44 after pulse 80 ended.

Given that Q36−Q34 is about equal to Q44−Q34, which is much larger than Q44−Q36, the voltages V62 and V64 can now be compared by a sense amplifier, for example, or other comparison circuit, to determine whether capacitor 52 started at state 34 representing one binary state, or state 36 representing the other binary state. It will be seen from the foregoing equations that if the ferroelectric capacitor 52 was originally in state 34, the voltages across capacitors 62 and 64 will be nearly equal following the read operation; while if the ferroelectric capacitor 52 was originally in state 36, the voltage across capacitor 64 will be much smaller than that across 62 since Q44−Q36 is much less than Q36−Q34. The voltage across capacitor 62 may, therefore, be easily halved using standard circuit design techniques, and used as a reference voltage for comparison against the voltage across capacitor 64, or compared with the voltage on node 82 by means of a variety of other standard voltage comparison techniques.

In this way, it can be seen that the double pulse read method is self-referencing and is essentially immune to vertical or horizontal drift of the hysteresis curve of FIG. 2, whatever the cause.

It will be appreciated that when pulse 80 ends, the state of capacitor 52 has been sensed. The second pulse 84 provides a reference for comparison purposes.

It is noteworthy that if capacitor 52 began at state 34, the two pulses 80 and 84 return it to essentially the same state, without destroying data. However, if capacitor 52 started at state 36, it ends up at state 34. This is adjusted by using the sensed data to restore capacitor 52 back to state 36 by driving bit lines 56 and 60 with corresponding voltages as described in the Eaton '746 application.

Other circuits can employ the double pulse read method so long as one pulse drives the ferroelectric capacitor to one state, and the second pulse drives it to the other state, or at least to a different, known condition, while developing values over time that can be combined, preferably by comparison, to determine the initial state of the capacitor.

The state of the ferroelectric capacitor 52 may be similarly written to any desired state by application of appropriate voltage signals phi 5 and phi 6 while simultaneously applying positive voltages to clocks phi 1 and phi 4.

I claim:

1. A non-volatile memory cell arrangement comprising a ferroelectric capacitor having two plates, a first bit line, a first switching device coupling one plate of said ferroelectric capacitor to said first bit line, a second bit line, a second switching device coupling the other plate of said capacitor to said second bit line, a first temporary storage device coupled to said first bit line, and a second temporary storage device coupled to said second bit line.

2. The cell of claim 1 further comprising a word line coupled to control both said first and second switching devices.

3. The cell of claim 2 wherein said switching devices comprise transistors.

4. The cell arrangement of claim 1 further comprising third switching device selectively coupling said first temporary storage device to said first bit line, and a fourth switching device selectively coupling said second temporary storage device to said second bit line,
   said third switching device being coupled to receive a first control signal, said fourth switching device being coupled to receive a second control signal distinct from said first control signal.

5. The cell arrangement of claim 4 further comprising fifth and sixth switching devices selectively coupling said first and second bit lines respectively to receive third and fourth control signals, distinct from each other.

6. The cell arrangement of claim 1 wherein said first and second switching devices comprise first and second transistors (54, 58), said first and second temporary storage devices comprise first and second capacitors (62, 64), further comprising a third transistor (66) selectively coupling said first capacitor (62) to said first bit line (56), a fourth transistor (68) selectively coupling said second capacitor (64) to said second bit line (60), said third and fourth transistors being coupled to receive respective control signals (PHI2, PHI3) distinct from each other, a first means (70) for coupling a first pulse (80) to said one capacitor plate, and a second means (74) for coupling a second pulse (84) to said another capacitor plate.

7. The cell arrangement of claim 6 wherein said first and second means for coupling comprise transistors each coupled to receive respective control signals (PHI1, PHI4) distinct from each other.

8. The cell arrangement of claim 6 further comprising a plurality of ferroelectric capacitors each with a corresponding pair of switching devices selectively coupling said ferroelectric capacitors between said bit lines, each said ferroelectric capacitor corresponding to a respective word line which is controllingly coupled to said switching devices between said bit lines, said ferroelectric capacitors thereby being arranged in a column, whereby said first and second capacitors (62, 64) correspond to a plurality of ferroelectric capacitors along said column.

9. A method to read data stored in a non-volatile memory cell which uses a ferroelectric capacitor comprising the steps of applying a first pulse to said capacitor and storing a first resulting signal, applying a second pulse to the capacitor to develop a second resulting signal, and combining said first and second resulting signals.

10. The method of claim 9 wherein said storing step includes storing charge on a capacitor.

11. The method of claim 9 wherein said first pulse is applied to said ferroelectric capacitor in a first polarity sense and said second pulse is applied in a second polarity sense.

12. The method of claim 11 wherein said first and second pulses each comprise voltage execursions of the same polarity but wherein one said pulse is applied to one plate of said ferroelectric capacitor and the other said pulse is applied to the other plate of said ferroelectric capacitor.

13. The method of claim 12 wherein said first pulse is applied via a first bit line coupled to one plate of said ferroelectric capacitor and said second pulse is applied via a second bit line coupled to the other plate of said ferroelectric capacitor.

14. The method of claim 13 wherein said method further includes isolating said ferroelectric capacitor from one storage device while coupling another storage device to said ferroelectric capacitor, and then isolating said ferroelectric capacitor from said another storage device while coupling it to said one storage device.

15. The method of claim 13 wherein said storing step includes storing said first resulting signal on a first storage capacitor and wherein said method further comprises storing said second resulting signal on a second storage capacitor.

16. The method of claim 13 wherein said first pulse drives said ferroelectric capacitor along one portion of a hysteresis loop and said second pulse drives said capacitor along a different portion of said loop.

17. A method of reading data stored in a non-volatile memory cell which uses a ferroelectric capacitor for storage, comprising the steps of:
   applying a first pulse to said ferroelectric capacitor and developing a signal on a first storage capacitor selectively coupled to said ferroelectric capacitor, while isolating said ferroelectric capacitor from a second storage capacitor; then
   applying a second pulse to said ferroelectric capacitor and developing a signal on a second storage capacitor selectively coupled to said ferroelectric capacitor while isolating said ferroelectric capacitor from said first storage capacitor; and
   combining signals from said first and second storage capacitors to determine the original polarization state of the ferroelectric capacitor.

* * * * *